United States Patent
Nie et al.

(10) Patent No.: US 10,916,641 B2
(45) Date of Patent: Feb. 9, 2021

(54) THIN FILM TRANSISTOR, METHOD OF MANUFACTURING THIN FILM TRANSISTOR, AND MANUFACTURING SYSTEM

(71) Applicant: WUHAN CHINA STAR OPTOELECTRONICS TECHNOLOGY CO., LTD., Wuhan (CN)

(72) Inventors: Xiaohui Nie, Wuhan (CN); Jiawei Zhang, Wuhan (CN)

( * ) Notice: Subject to any disclaimer, the term of this patent is extended or adjusted under 35 U.S.C. 154(b) by 4 days.

(21) Appl. No.: 16/467,046

(22) PCT Filed: Mar. 22, 2019

(86) PCT No.: PCT/CN2019/079275
§ 371 (c)(1),
(2) Date: Jun. 6, 2019

(87) PCT Pub. No.: WO2020/107753
PCT Pub. Date: Jun. 4, 2020

(65) Prior Publication Data
US 2020/0227538 A1   Jul. 16, 2020

(30) Foreign Application Priority Data
Nov. 30, 2018 (CN) .......................... 2018 1 1459682

(51) Int. Cl.
| H01L 29/10 | (2006.01) |
| H01L 29/66 | (2006.01) |
| H01L 21/265 | (2006.01) |
| H01L 29/786 | (2006.01) |

(52) U.S. Cl.
CPC .. *H01L 29/66757* (2013.01); *H01L 21/26513* (2013.01); *H01L 29/78642* (2013.01)

(58) Field of Classification Search
CPC ......... H01L 27/66757; H01L 29/78642; H01L 21/26513
See application file for complete search history.

(56) References Cited

U.S. PATENT DOCUMENTS

| 2008/0017865 A1 | 1/2008 | Itoh et al. |
| 2008/0142803 A1 | 6/2008 | Kaitoh et al. |
| 2008/0203477 A1 | 8/2008 | Yamazaki et al. |

(Continued)

FOREIGN PATENT DOCUMENTS

| CN | 1516128 A | 8/2004 |
| CN | 101110435 A | 1/2008 |

(Continued)

*Primary Examiner* — Phuc T Dang

(57) ABSTRACT

The present application provides a thin film transistor, a method of manufacturing a thin film transistor, and a manufacturing system. The thin film transistor includes a substrate, a buffer layer, an active layer, and a gate insulating layer. A side area of the active layer is doped and modified, so that a surface of the side area is formed as a high resistance area, and then the gate insulating layer is formed by a chemical deposition process, thereby to avoid a weak channel current produced by unintentional electrically conduction of a boundary of the active layer due to a thinner thickness of the gate insulating layer when operating, thereby increasing electrical reliability of the thin film transistor.

17 Claims, 6 Drawing Sheets

(56) References Cited

U.S. PATENT DOCUMENTS

| | | | |
|---|---|---|---|
| 2010/0291740 A1 | 11/2010 | Makita | |
| 2013/0037783 A1* | 2/2013 | Lee | H01L 27/3265 257/40 |
| 2015/0380565 A1 | 12/2015 | Xie | |
| 2016/0027855 A1* | 1/2016 | Kim | H01L 27/127 257/72 |
| 2017/0018652 A1* | 1/2017 | Liu | H01L 27/1288 |
| 2018/0033883 A1* | 2/2018 | Zhou | H01L 27/1248 |
| 2019/0027587 A1* | 1/2019 | Li | H01L 21/26513 |

FOREIGN PATENT DOCUMENTS

| | | |
|---|---|---|
| CN | 101252134 A | 8/2008 |
| CN | 104091832 A | 10/2014 |

* cited by examiner

THIN FILM TRANSISTOR, METHOD OF MANUFACTURING THIN FILM TRANSISTOR, AND MANUFACTURING SYSTEM

BACKGROUND OF INVENTION

1. Field of Invention

The present application relates to a display field, and particularly, to a thin film transistor, a method of manufacturing a thin film transistor, and a manufacturing system.

2. Related Art

In order to avoid display defects caused by a large leakage current, conventional low temperature poly silicon-thin film transistors (LTPS-TFTs) are generally configured with a top gate structure, using a self-aligned feature to fabricate a lightly doped drain (LDD) structure to reduce a leakage current in channels. As shown in FIG. 1, in actual production, since LTPS-TFTs are formed by a dry etching process to form a silicon island pattern, when a gate insulating layer 200 is formed on a silicon island 100 by a chemical vapor deposition process, a gate insulating layer 201 formed on a side area of the silicon island 100 is thinner, but a gate insulating layer 202 formed on a top area of the silicon island 100 is thicker. When a thin film transistor (TFT) is operating, an area where the gate insulating layer 202 is located is unintentionally electrically conducted in advance and produces a weak channel current, causing a hump effect, and resulting in a decrease in electrical reliability of devices.

Therefore, it is imperative to achieve a technical solution by providing a technique to mitigate the hump effect caused by a thinner gate insulating layer formed at an existing silicon island boundary.

SUMMARY OF INVENTION

The present application provides a thin film transistor and a method of fabricating the same to mitigate a technical problem that a hump effect caused by a thinner gate insulating layer formed at an existing silicon island boundary.

To overcome the above-mentioned problems, the present application provides a technical solution as follows:

The present application provides a method of manufacturing a thin film transistor, comprising steps:

step S1, providing a glass substrate, and forming a buffer layer and a polysilicon active layer sequentially on the substrate;

step S2, coating the active layer with a photoresist, and etching away a portion of the active layer not covered by the photoresist;

step S3, doping and modifying a side of the active layer to enable the side of the active layer to be a high resistance area;

step S4, stripping the photoresist on a top surface of the active layer being doped after the doping and modifying of the side of the active layer is completed; and step S5, forming a gate insulating layer on the active layer.

In the manufacturing method of the present application, the doping a side of the active layer to enable the side of the active layer to be a high resistance area comprises doping the side of the active layer by using a directional ion implantation technique to enable the side of the active layer to be the high resistance area.

In the manufacturing method of the present application, the thin film transistor is an N-type thin film transistor, and ions doped on the side of the active layer in the step S3 are a group V compound.

In the manufacturing method of the present application, ions doped on the side of the active layer in the step S3 are phosphorus hydride ($PH_3$).

In the manufacturing method of the present application, the thin film transistor is a P-type thin film transistor, and ions doped on the side of the active layer in the step S3 are a group III compound.

In the manufacturing method of the present application, ions doped on the side of the active layer in the step S3 are boron trifluoride ($BF_3$).

In the manufacturing method of the present application, ion implantation energy applied in the step of doping and modifying the side of the active layer by using the directional ion implantation technique is 10-15 keV.

In the manufacturing method of the present application, the step S2 specifically comprises following steps:

step S21, coating a surface of the active layer away from the substrate with a photoresist layer, and the photoresist layer completely covering the active layer;

step S22, exposing the photoresist layer with a halftone mask, and developing the exposed photoresist layer with a developer to form a photoresist pattern; and step S23, performing a dry etching process on the active layer by using the photoresist pattern as a mask layer, and removing a portion of the active layer not covered by the photoresist pattern.

Furthermore, the present application provides a thin film transistor, comprising:

a substrate;

a buffer layer disposed on the substrate;

an active layer disposed on the buffer layer, a side of the active layer defined as a high resistance area; and a gate insulating layer disposed on a surface of the active layer.

The present application further provides a system for manufacturing a thin film transistor, comprising:

a buffer layer preparation device, provided to deposit a buffer layer on a glass substrate;

an active layer preparation device, provided to deposit a polysilicon active layer on the buffer layer;

a silicon island patterning device, provided to coat the active layer with a photoresist, and to etch away a portion of the active layer not covered by the photoresist to form a silicon pattern;

a doping device, provided to dope and modify a side of the active layer to enable a high resistance area on the side of the active layer;

a photoresist removing device, provided to strip a photoresist on a top surface of the active layer being doped after doping and modifying of the side of the active layer is completed; and a gate preparation device, provided to form a gate insulating layer on the active layer.

In the system for manufacturing the thin film transistor, the doping device comprises an ion implantation portion, configured to dope and modify the side of the active layer through a directional ion implantation technique, so that the side of the active layer is formed as the high resistance area.

In the system for manufacturing the thin film transistor, the thin film transistor is an N-type thin film transistor, and ions doped by the ion implantation portion are a group V compound.

In the system for manufacturing the thin film transistor, ions doped by the ion implantation portion are phosphorus hydride ($PH_3$).

In the system for manufacturing the thin film transistor, the thin film transistor is a P-type thin film transistor, and ions doped by the ion implantation portion are a group III compound.

In the system for manufacturing the thin film transistor, ions doped by the ion implantation portion are boron trifluoride ($BF_3$).

In the system for manufacturing the thin film transistor, the ion implantation portion operates with ion implantation energy of 10-15 keV.

In the system for manufacturing the thin film transistor, the silicon island patterning device comprises:

a photoresist coating apparatus, configured to coat a photoresist layer on a surface of the active layer away from the substrate, wherein the photoresist layer completely covers the active layer;

a photoresist pattern forming member, configured to expose the photoresist layer with a halftone mask, and to develop the exposed photoresist layer with a developer to form a photoresist pattern; and an etching member, configured to perform a dry etching on the active layer with the photoresist pattern as a mask layer, and remove a portion of the active layer not covered by the photoresist pattern.

In the system for manufacturing the thin film transistor, the active preparation device is provided to deposit an amorphous silicon active layer on the buffer layer, and to perform an excimer laser annealing process on the amorphous silicon active layer to convert amorphous silicon into polycrystalline silicon.

In the system for manufacturing the thin film transistor, the gate preparation device is provided to form a gate insulating layer on the active layer through chemical deposition.

The embodiments of the present application provide a thin film transistor, a method of manufacturing a thin film transistor, and a manufacturing system. The thin film transistor includes a substrate, a buffer layer, an active layer, and a gate insulating layer. After a silicon island pattern is formed on the active layer, a side area of the active layer not protected by a photoresist is doped and modified though an ion implantation doping technique, so that a surface of the side area is formed as a high resistance area, and then the gate insulating layer is formed by a chemical deposition process. Because a side surface of the active layer tilts at a certain inclined angle after being formed dry etching, the gate insulating layer deposited on the side surface of the active layer is thinner than other portions of the gate insulating layer. Forming the side area of the active layer as a high-resistance structure can avoid a weak channel current produced by an unintentional electrically conduction of a boundary of the active layer due to a thinner thickness of the gate insulating layer when operating, thereby improving boundary effect and increasing electrical reliability of the device.

BRIEF DESCRIPTION OF DRAWINGS

To describe the technical solutions in the embodiments of the present application, the following briefly introduces the accompanying drawings for describing the embodiments. Apparently, the accompanying drawings in the following description show merely some embodiments of the present application, and a person skilled in the art may still derive other drawings from these accompanying drawings without creative efforts.

DESCRIPTION OF PREFERRED EMBODIMENTS

Figure 1:
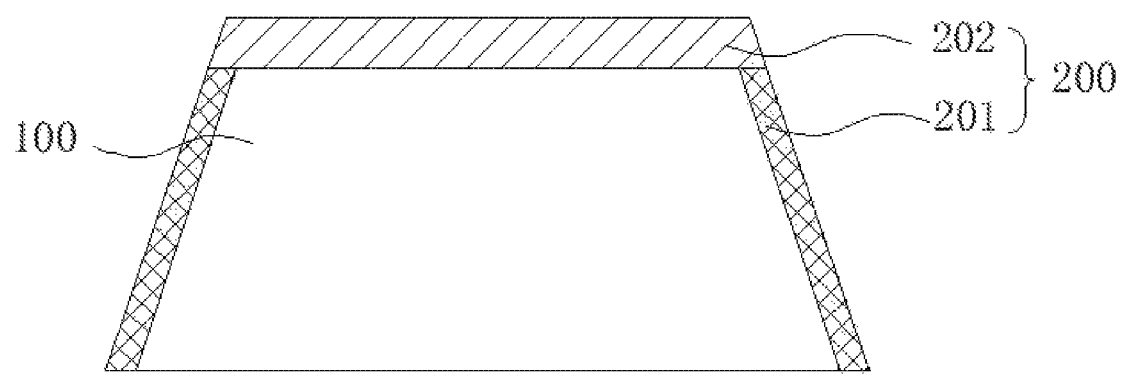
FIG. 1 is a schematic structural view of an existing low temperature poly-silicon thin film transistor (LTPS-TFT).

The following embodiments are referring to the accompanying drawings for exemplifying specific implementable embodiments of the present disclosure. Furthermore, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, elements with similar structures are labeled with like reference numerals.

The present application is directed to a hump effect caused by a thinner gate insulating layer formed at a silicon island boundary of an existing thin film transistor, and this embodiment can mitigate the hump defect.

Figure 2:
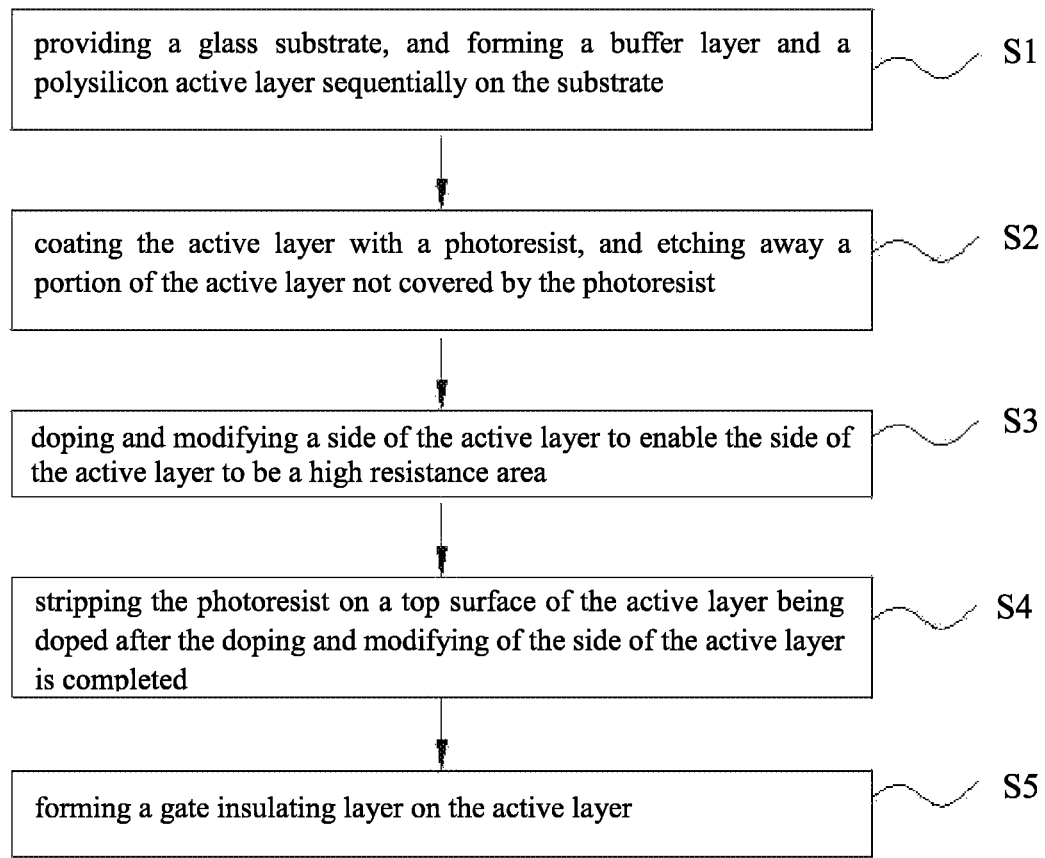
FIG. 2 is a flowchart of a method of manufacturing a thin film transistor in accordance with an embodiment of the present application.

As shown in FIG. 2, a specific embodiment of the present application provides a method of manufacturing a thin film transistor, and the method includes steps as follows:

step S1, providing a glass substrate, and forming a buffer layer and a polysilicon active layer sequentially on the substrate;

step S2, coating the active layer with a photoresist, and etching away a portion of the active layer not covered by the photoresist;

step S3, doping and modifying a side of the active layer to enable the side of the active layer to be a high resistance area;

step S4, stripping the photoresist on a top surface of the active layer being doped after the doping and modifying of the side of the active layer is completed; and step S5, forming a gate insulating layer on the active layer.

A preparation process of the thin film transistor provided by the specific embodiment of the present application will be described in detail below with reference to accompanying drawings.

Preferably, the thin film transistor may be exemplified by a top gate type low temperature polysilicon thin film transistor.

Figure 3A:
FIGS. 3A-3I are schematic structural views each showing a thin film transistor at a different stage of a manufacturing process.

As shown in FIG. 3A, first, a substrate 10 is provided, a buffer layer 20 is formed on the substrate 10, and an amorphous silicon film layer is formed on the buffer layer 20. The amorphous silicon film layer is converted into a polysilicon active layer 30 through a low temperature crystallization process.

The substrate 10 is mostly made of a glass material to prevent harmful substances in the substrate 10 from adversely affecting performance of the active layer 30. It is necessary to first form the buffer layer 20 on the substrate 10 by chemical vapor deposition or sputtering to block diffusion of impurities contained in the glass into the active layer 30. Additionally, pre-cleaning of the substrate 10 is required before the deposition of the buffer layer 20, so that cleanliness of the substrate 10 is improved The buffer layer 20 may be made of an oxide, a nitride or an oxynitride, and the buffer layer 20 may be a single layer, a double layer or a multilayered structure. Specifically, the buffer layer 31 may be SiNx, SiOx or Si(ON)x.

The conversion of amorphous silicon into polycrystalline silicon in the active layer 30 can be performed by excimer laser annealing. When excimer laser annealing crystallization is used, commonly used excimer lasers are cesium chloride (XeCl) laser, ArF laser, KrF laser, and XeF laser. Such an excimer laser generates a laser beam in an ultraviolet band, and irradiates amorphous silicon in the active layer 30 through a short pulse laser beam in the ultraviolet band, so that amorphous silicon can quickly absorbs laser energy and melts and recrystallizes.

When amorphous silicon is converted into polysilicon by excimer laser annealing to form the active layer 30, the buffer layer 20 can reduce thermal diffusion between the polysilicon active layer 30 and the substrate 10, and mitigate the influence of temperature rise on the substrate 10 during annealing.

Certainly, in the present application, other methods such as metal induced lateral crystallization, solid phase crystallization, excimer laser crystallization, and rapid thermal annealing may be employed in a low temperature crystallization process.

Figure 3B:
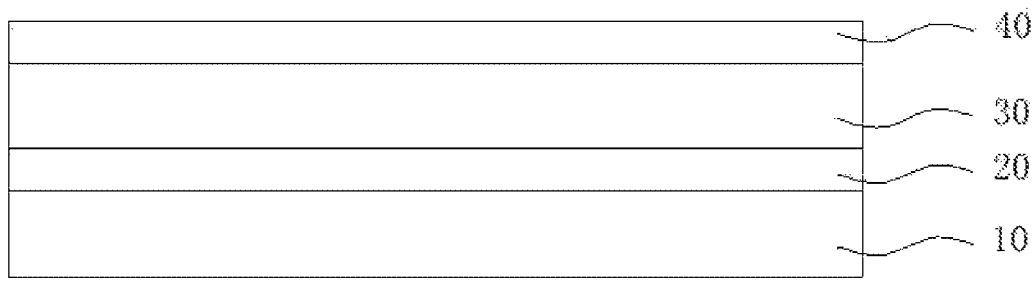

As shown in FIG. 3B, a uniform thickness of a photoresist layer 40 is applied to a surface of the active layer 30 away from the substrate 10, and the photoresist layer 40 completely covers the active layer 30. Specifically, the photoresist layer 40 can be a photoresist.

Figure 3C:
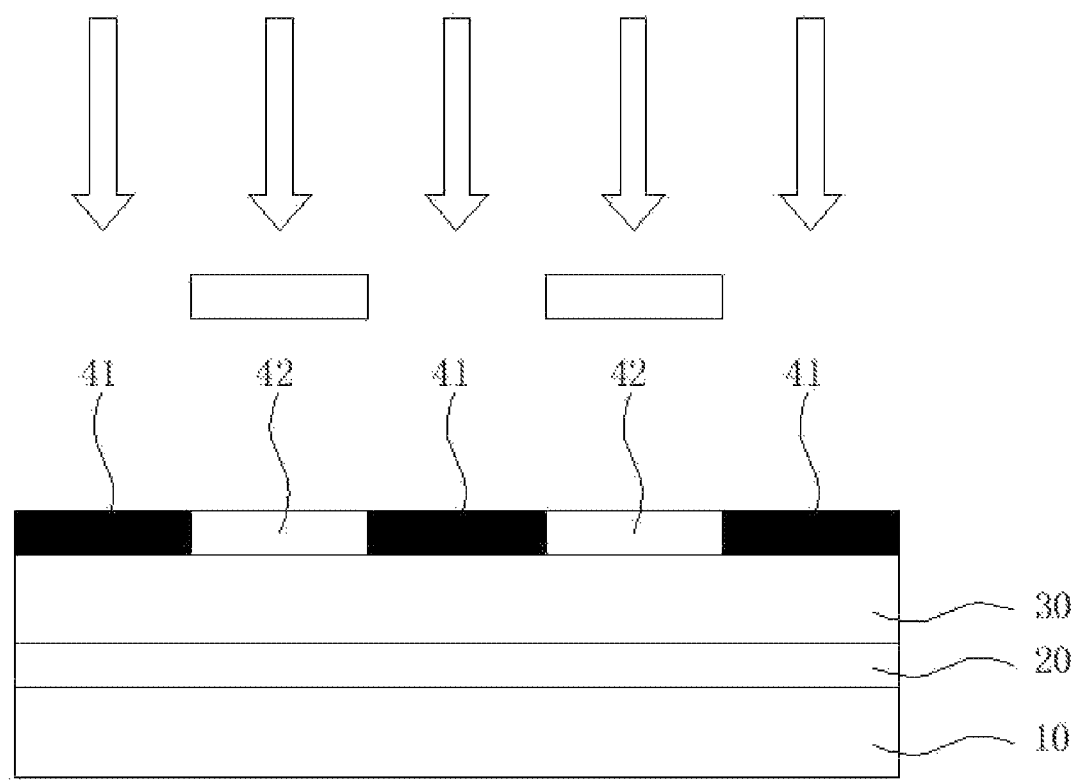
Figure 3D:
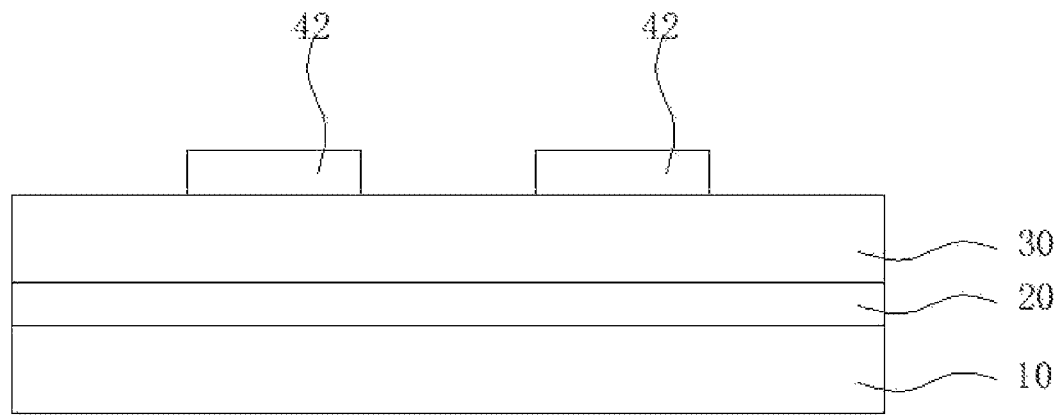

As shown in FIG. 3C and FIG. 3D, the photoresist layer 40 is exposed by a halftone mask, exposed portions of the photoresist layer 41 are dissolved by a developer, and then the dissolved photoresist layer 41 is washed away with deionized water to form a photoresist pattern 42.

Figure 3E:
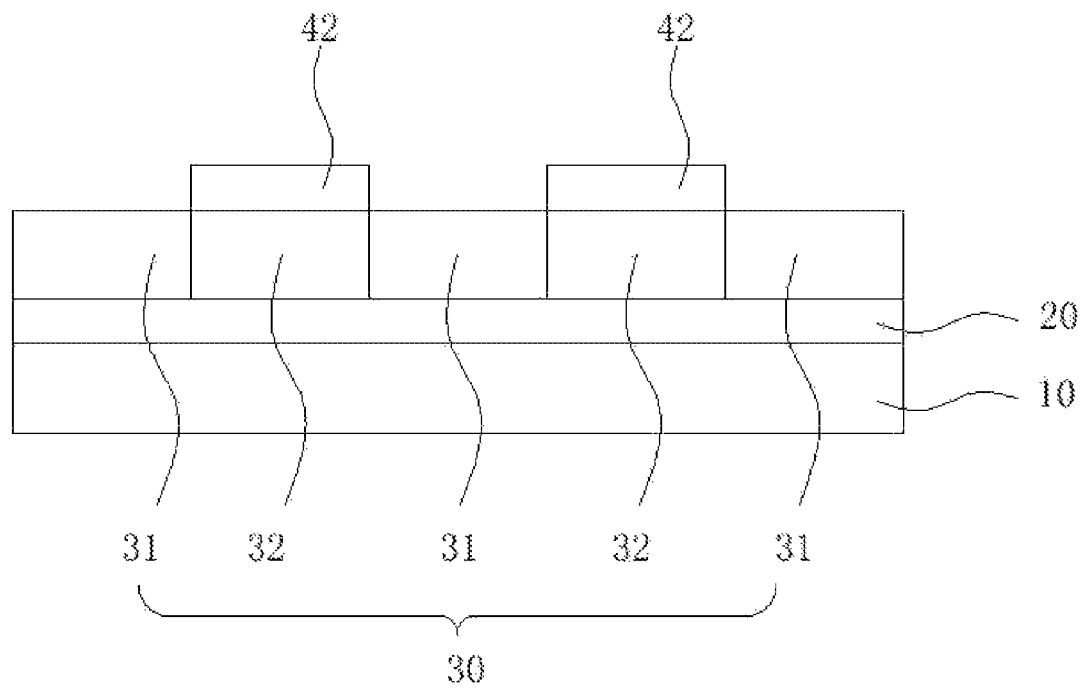
Figure 3F:
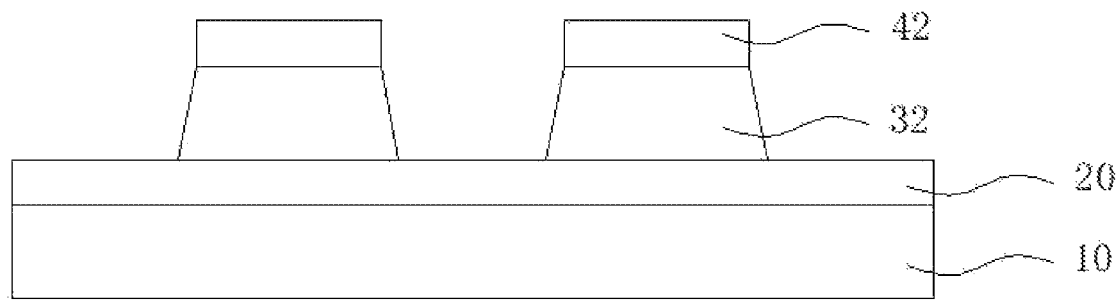

As shown in FIG. 3E and FIG. 3F, the active layer 30 includes a first area 31 blocked by the photoresist pattern 42 and a second area 32 not blocked by the photoresist pattern 32. The first area 31 on the active layer 30 is etched away by a dry etching process, leaving the second area 32.

Figure 3G:
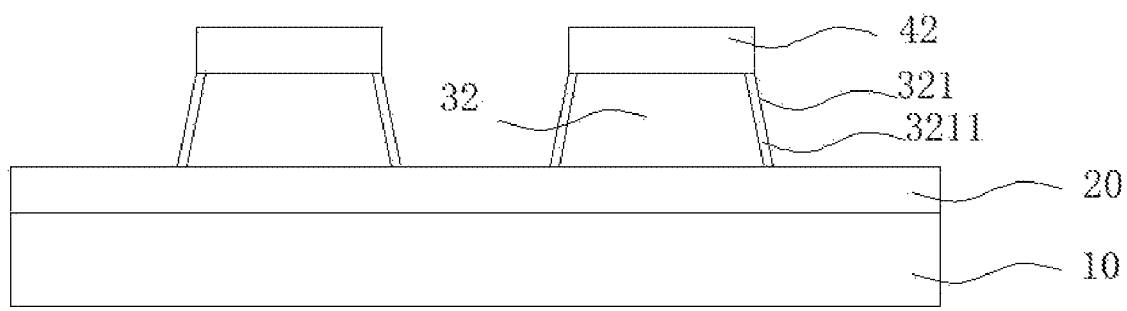

As shown in FIG. 3G, due to the use of dry etching, a side surface 321 of the second area 32 has a certain inclined angle. The side surface 321 is doped and modified by a directional ion implantation technique, to enable a surface layer 3211 to be a high resistance area.

Since intrinsic polysilicon is not electrically conductive, the intrinsic polysilicon can be made into a semiconductor with a specific electrically conductivity type by specific ion doping. Conventional low-temperature polysilicon thin film transistors can be classified into an N-type thin film transistor and a P-type thin film transistor according to types of channel carriers. A doping substance corresponding to the N-type thin film transistor belongs to a group III compound, such as $BF_3$, and a doping substance corresponding to the P-type thin film transistor belongs to a group V compounds, such as $PH_3$.

Therefore, if a low temperature polysilicon thin film transistor is an N type thin film transistor, it is necessary to dope the surface layer 3211 of the second area 32 with $PH_3$ or other group V compounds to form a high resistance area. If a low temperature polysilicon thin film transistor is an N type thin film transistor, it is necessary to dope the surface layer 3211 of the second area 32 with PH3 or other group V compounds to form a high resistance area. Because N-type ions, such as phosphorus ions and phosphorus hydride, and P-type ions, such as boron ions and boron trifluoride, have a potential difference with respect to a polycrystalline silicon substrate, the potential difference produced by the N-type ions and the P-type ions between polysilicon substrates needs to be overcome when transferring electrons, which makes electrons transferring difficult, thereby to achieve a purpose of increasing a resistance value of the surface layer 3211.

Specifically, a method of doping is performed by a directional ion implantation, and ion implantation energy applied is 10-15 keV.

Figure 3H:
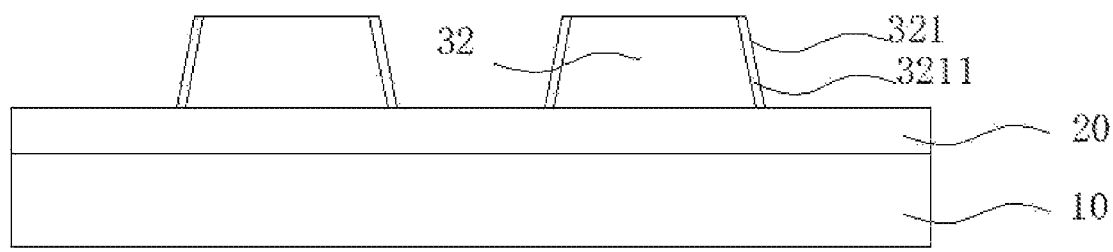

As shown in FIG. 3H, the photoresist pattern 42 is stripped after ion implantation is completed.

Figure 3I:
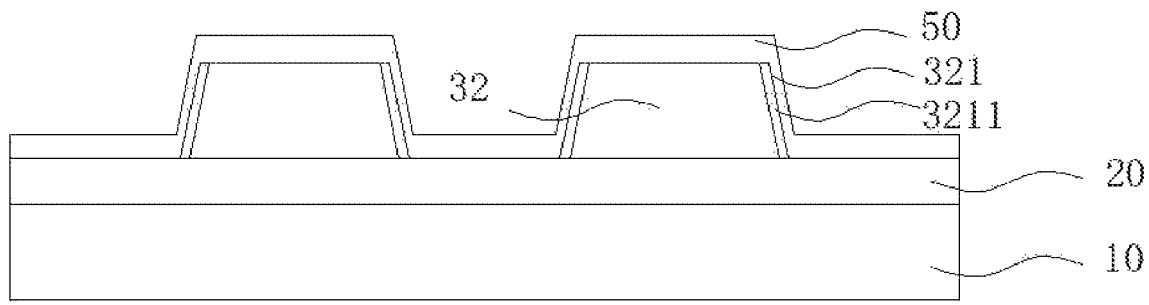

As shown in FIG. 3I, a gate insulating layer 50 is formed on the second area 32.

Since a thin film transistor (TFT) channel path is formed at an interface between the second area 32 and the gate insulating layer 50, a cleaning process of the interface is beneficial to reduce interface energy and thereby to improve performance of the TFT. Therefore, the gate insulating layer 50 is to be deposited after performing interface cleaning on the second region 32.

The manufacturing method further includes sequentially forming a gate layer, an interlayer dielectric layer, a source layer, and a drain layer on the gate insulating layer 50 from bottom to top.

According to the above-mentioned structure, because the side surface 321 of the second area 32 tilts at a certain inclined angle after being formed dry etching, a thickness of the gate insulating layer 50 formed subsequently is not uniform. The gate insulating layer 50 is thicker on a top surface of the second area 32, and the gate insulating layer 50 is thinner on a side surface of the second area 32. Therefore, after the voltage is applied to a gate, a thinner side area of the gate insulating layer 50 is electrically conducted first, and a thicker top surface area of the gate insulating layer 50 is then electrically conducted. A channel located under the gate insulating layer 50 is not simultaneously inverted, causing a difference in a slope of an Id-Vg characteristic curve of a device, and resulting in an inflection point at the characteristic curve, which is the so-called hump effect, and thus reducing stability of the device operation.

With the above-mentioned design, the surface layer 3211 of the second area 32 is formed as a high resistance area, and the gate insulating layer 50 is prepared subsequently. Therefore, after the voltage is applied to the gate, the top surface and the side surface of the gate insulating layer 50 are electrically conducted at the same time, and a channel located under the gate insulating layer 50 is simultaneously inverted, thereby improving boundary effect and increasing electrical reliability of the device.

Figure 4:
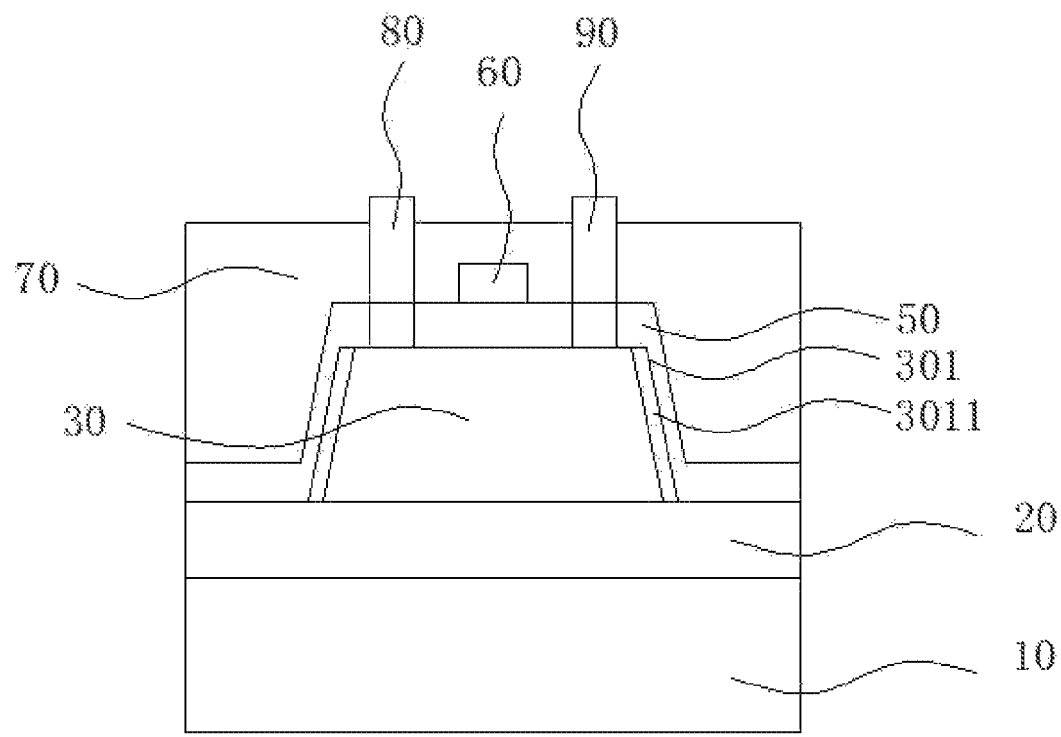
FIG. 4 is a schematic structural view of a thin film transistor in accordance with an embodiment of the present application.

As shown in FIG. 4, the present application further provides a thin film transistor (TFT) including a substrate 10, a buffer layer 20 disposed on the substrate 10, a polysilicon active layer 30 disposed on the buffer layer 20, a gate insulating layer 50 covering the polysilicon active layer 30, a gate 60 disposed on the gate insulating layer 50, an interlayer dielectric layer 70 covering the gate 60 on the gate insulating layer 50, and a source 80 and a drain 90 disposed on the interlayer dielectic layer 70, wherein the source 80 and the drain 90 are connected to the active layer 30 through via holes of the gate insulating layer 50 and the interlayer dielectric layer 70, respectively.

The buffer layer 20 and an amorphous silicon active layer 30 are sequentially deposited on the substrate 10, and amorphous silicon is converted into polycrystalline silicon by a low temperature crystallization process. A photoresist 40 (not shown in FIG. 4) is applied to the active layer 30, and the photoresist 40 is exposed and developed by a photolithography process. Then, a portion of the active layer 30 not protected by the photoresist 40 is etched away by an etching process, and a side 301 of the active layer 30 is doped and modified by ion implantation doping technology to enable a surface 3011 of the side 301 to be a high resistance area. The photoresist 40 on a top surface of the active layer 30 is stripped after ion implantation is completed. Then, the gate insulating layer 50, the gate 60, the interlayer dielectric layer 70, the source 80, and the drain 90 are formed on the active layer 30 in sequence to form the thin film transistor.

Specifically, in the above-mentioned thin film transistor, because the side surface 321 of the second area 32 tilts at a certain inclined angle after dry etching, a thickness of the gate insulating layer 50 formed subsequently is not uniform. The gate insulating layer 50 is thicker on a top surface of the second area 32, and the gate insulating layer 50 is thinner on a side surface of the second area 32. Use the ion implantation doping technology to dope and modify the side 301 of the active layer 30 to enable the surface 3011 to be a high resistance area. Then, the gate insulating layer 50 is formed. Therefore, after the voltage is applied to the gate 60, the top surface and the side surface of the gate insulating layer 50 are electrically conducted at the same time, and a channel located under the gate insulating layer 50 is simultaneously inverted, thereby improving boundary effect and increasing electrical reliability of the device.

The present application further provides a system for manufacturing a thin film transistor, including a buffer layer preparation device, provided to deposit a buffer layer on a glass substrate; an active layer preparation device, provided to deposit a polysilicon active layer on the buffer layer; a silicon island patterning device, provided to coat the active layer with a photoresist, and to etch away a portion of the active layer not covered by the photoresist to form a silicon pattern; a doping device, provided to dope and modify a side of the active layer to enable a high resistance area on the side of the active layer; a photoresist removing device, provided to strip a photoresist on a top surface of the active layer being doped after doping and modifying of the side of the active layer is completed; and a gate preparation device, provided to form a gate insulating layer on the active layer.

In one embodiment, the doping device includes an ion implantation portion, configured to dope and modify the side of the active layer through a directional ion implantation technique, so that the side of the active layer is formed as the high resistance area.

In one embodiment, the thin film transistor is an N-type thin film transistor, and ions doped by the ion implantation portion are a group V compound.

In one embodiment, ions doped by the ion implantation portion are phosphorus hydride ($PH_3$).

In one embodiment, the thin film transistor is a P-type thin film transistor, and ions doped by the ion implantation portion are a group III compound.

In one embodiment, ions doped by the ion implantation portion are boron trifluoride ($BF_3$).

In one embodiment, the ion implantation portion operates with ion implantation energy of 10-15 keV.

In one embodiment, the silicon island patterning device includes a photoresist coating apparatus, configured to coat a photoresist layer on a surface of the active layer away from the substrate, wherein the photoresist layer completely covers the active layer; a photoresist pattern forming member, configured to expose the photoresist layer with a halftone mask, and to develop the exposed photoresist layer with a developer to form a photoresist pattern; and an etching member, configured to perform a dry etching on the active layer with the photoresist pattern as a mask layer, and remove a portion of the active layer not covered by the photoresist pattern.

In one embodiment, an active preparation device is provided to deposit an amorphous silicon active layer on the buffer layer, and to perform an excimer laser annealing process on the amorphous silicon active layer to convert amorphous silicon into polycrystalline silicon.

In one embodiment, the gate preparation device is provided to form a gate insulating layer on the active layer through chemical deposition.

According to the above-mentioned embodiments, the embodiments of the present application provide a thin film transistor, a method of manufacturing a thin film transistor, and a manufacturing system. The thin film transistor includes a substrate, a buffer layer, an active layer, and a gate insulating layer. After a silicon island pattern is formed on the active layer, a side area of the active layer not protected by a photoresist is doped and modified though an ion implantation doping technique, so that a surface of the side area is formed as a high resistance area, and then the gate insulating layer is formed by a chemical deposition process. Because a side surface of the active layer tilts at a certain inclined angle after being formed dry etching, the gate insulating layer deposited on the side surface of the active layer is thinner than other portions of the gate insulating layer. Forming the side area of the active layer as a high-resistance structure can avoid a weak channel current produced by unintentional electrically conduction of a boundary of the active layer due to a thinner thickness of the gate insulating layer when operating, thereby improving boundary effect and increasing electrical reliability of the device.

Accordingly, although the present application has been disclosed as the above preferred embodiment, the preferred embodiment is not intended to limit the present application. Those skilled in the art without departing from the spirit and scope of the present application may make various changes or modifications, and thus the scope of the present application should be after the appended claims and their equivalents.

What is claimed is:

1. A method of manufacturing a thin film transistor, comprising steps:

step S1, providing a glass substrate, and forming a buffer layer and a polysilicon active layer sequentially on the substrate;

step S2, coating the active layer with a photoresist, and etching away a portion of the active layer not covered by the photoresist;

step S3, doping and modifying a side of the active layer to enable the side of the active layer to be a high resistance area;

step S4, stripping the photoresist on a top surface of the active layer being doped after the doping and modifying of the side of the active layer is completed; and step S5, forming a gate insulating layer on the active layer;

wherein the step S2 specifically comprises following steps:

step S21, coating a surface of the active layer away from the substrate with a photoresist layer, and the photoresist layer completely covering the active layer;

step S22, exposing the photoresist layer with a halftone mask, and developing the exposed photoresist layer with a developer to form a photoresist pattern; and step S23, performing a dry etching process on the active layer by using the photoresist pattern as a mask layer, and removing a portion of the active layer not covered by the photoresist pattern.

2. The manufacturing method of claim 1, wherein the doping a side of the active layer to enable the side of the active layer to be a high resistance area comprises doping the side of the active layer by using a directional ion implantation technique to enable the side of the active layer to be the high resistance area.

3. The manufacturing method of claim 2, wherein the thin film transistor is an N-type thin film transistor, and ions doped on the side of the active layer in the step S3 are a group V compound.

4. The manufacturing method of claim 3, wherein ions doped on the side of the active layer in the step S3 are phosphorus hydride ($PH_3$).

5. The manufacturing method of claim 2, wherein the thin film transistor is a P-type thin film transistor, and ions doped on the side of the active layer in the step S3 are a group III compound.

6. The manufacturing method of claim 5, wherein ions doped on the side of the active layer in the step S3 are boron trifluoride ($BF_3$).

7. The manufacturing method of claim 2, wherein ion implantation energy applied in the step of doping and modifying the side of the active layer by using the directional ion implantation technique is 10-15 keV.

8. A system for manufacturing a thin film transistor, comprising:
a buffer layer preparation device, provided to deposit a buffer layer on a glass substrate;
an active layer preparation device, provided to deposit a polysilicon active layer on the buffer layer;
a silicon island patterning device, provided to coat the active layer with a photoresist, and to etch away a portion of the active layer not covered by the photoresist to form a silicon pattern;
a doping device, provided to dope and modify a side of the active layer to enable a high resistance area on the side of the active layer;
a photoresist removing device, provided to strip a photoresist on a top surface of the active layer being doped after doping and modifying of the side of the active layer is completed; and
a gate preparation device, provided to form a gate insulating layer on the active layer.

9. The system for manufacturing the thin film transistor of claim 8, wherein the doping device comprises an ion implantation portion, configured to dope and modify the side of the active layer through a directional ion implantation technique, so that the side of the active layer is formed as the high resistance area.

10. The system for manufacturing the thin film transistor of claim 9, wherein the thin film transistor is an N-type thin film transistor, and ions doped by the ion implantation portion are a group V compound.

11. The system for manufacturing the thin film transistor of claim 10, wherein ions doped by the ion implantation portion are phosphorus hydride ($PH_3$).

12. The system for manufacturing the thin film transistor of claim 9, wherein the thin film transistor is a P-type thin film transistor, and ions doped by the ion implantation portion are a group III compound.

13. The system for manufacturing the thin film transistor of claim 12, wherein ions doped by the ion implantation portion are boron trifluoride ($BF_3$).

14. The system for manufacturing the thin film transistor of claim 9, wherein the ion implantation portion operates with ion implantation energy of 10-15 keV.

15. The system for manufacturing the thin film transistor of claim 8, wherein the silicon island patterning device comprises:
a photoresist coating apparatus, configured to coat a photoresist layer on a surface of the active layer away from the substrate, wherein the photoresist layer completely covers the active layer;
a photoresist pattern forming member, configured to expose the photoresist layer with a halftone mask, and to develop the exposed photoresist layer with a developer to form a photoresist pattern; and
an etching member, configured to perform a dry etching on the active layer with the photoresist pattern as a mask layer, and remove a portion of the active layer not covered by the photoresist pattern.

16. The system for manufacturing the thin film transistor of claim 8, wherein the active layer preparation device is provided to deposit an amorphous silicon active layer on the buffer layer, and to perform an excimer laser annealing process on the amorphous silicon active layer to convert amorphous silicon into polycrystalline silicon.

17. The system for manufacturing the thin film transistor of claim 8, wherein the gate preparation device is provided to form the gate insulating layer on the active layer through chemical deposition.

* * * * *